(12) United States Patent
DiPietro et al.

(10) Patent No.: US 7,951,525 B2
(45) Date of Patent: May 31, 2011

(54) LOW OUTGASSING PHOTORESIST COMPOSITIONS

(75) Inventors: Richard A. DiPietro, Campbell, CA (US); Ratnam Sooriyakumaran, San Jose, CA (US); Sally A. Swanson, San Jose, CA (US); Hoa D. Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 12/206,065

(22) Filed: Sep. 8, 2008

(65) Prior Publication Data

US 2010/0062368 A1    Mar. 11, 2010

(51) Int. Cl.
*G03F 7/00* (2006.01)
*G03F 7/004* (2006.01)
*C08F 234/02* (2006.01)

(52) U.S. Cl. .............. 430/270.1; 430/905; 430/913; 526/266

(58) Field of Classification Search ............ 430/270.1, 430/905, 913
See application file for complete search history.

(56) References Cited

U.S. PATENT DOCUMENTS

| | | | |
|---|---|---|---|
| 4,189,323 A | 2/1980 | Buhr | |
| 4,284,706 A | 8/1981 | Clecak et al. | |
| 4,442,197 A | 4/1984 | Crivello et al. | |
| 4,603,101 A | 7/1986 | Crivello | |
| 4,624,912 A | 11/1986 | Zweifel et al. | |
| 5,243,053 A | 9/1993 | Zia-Ebrahimi | |
| 5,272,232 A * | 12/1993 | Han et al. | 526/242 |
| 5,326,826 A * | 7/1994 | Roeschert et al. | 525/326.5 |
| 5,344,742 A | 9/1994 | Sinta et al. | |

(Continued)

FOREIGN PATENT DOCUMENTS

JP     55059181 A   *   5/1980

OTHER PUBLICATIONS

Chauhan, Maharashi M. et al., "Outgassing of photoresists in extreme ultraviolet lithography", J. Vac. Sci. Technol. B 18(6). Nov./Dec. 2000. © 2000 American Vacuum Society, pp. 3402-3407.

(Continued)

*Primary Examiner* — Amanda C. Walke
(74) *Attorney, Agent, or Firm* — Cantor Colburn LLP

(57) ABSTRACT

Polymers for use in photoresist compositions include a repeat unit having a formula of:

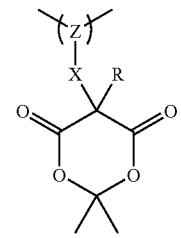

wherein Z represents a repeat unit of a polymer backbone; X is a linking group selected from the group consisting of alkylene, arylene, araalkylene, carbonyl, carboxyl, carboxyalkylene, oxy, oxyalkylene, and combinations thereof, and R is selected from the group consisting of hydrogen, alkyl, aryl, and cycloalkyl groups with the proviso that X and R are not part of the same ring system. Also disclosed are processes for patterning a relief image of the photoresist composition, wherein the photoresist composition has an outgassing rate of less than 6.5E+14 molecules/cm$^2$/s.

20 Claims, 4 Drawing Sheets

U.S. PATENT DOCUMENTS

| | | | | |
|---|---|---|---|---|
| 5,352,742 | A * | 10/1994 | Han et al. | 525/276 |
| 5,403,908 | A * | 4/1995 | Watanabe et al. | 526/284 |
| 5,580,694 | A | 12/1996 | Allen et al. | |
| 5,660,969 | A | 8/1997 | Kaimoto | |
| 5,679,495 | A | 10/1997 | Yamachika et al. | |
| 5,723,258 | A * | 3/1998 | Kim et al. | 430/270.1 |
| 5,932,391 | A * | 8/1999 | Ushirogouchi et al. | 430/270.1 |
| 5,976,759 | A * | 11/1999 | Urano et al. | 430/270.1 |
| 6,171,522 | B1 * | 1/2001 | Michot et al. | 252/500 |
| 6,265,130 | B1 | 7/2001 | Lee et al. | |
| 6,365,321 | B1 * | 4/2002 | Chen et al. | 430/270.1 |
| 6,369,279 | B1 * | 4/2002 | Nakashima et al. | 568/630 |
| 6,376,632 | B1 | 4/2002 | Lee et al. | |
| 6,399,273 | B1 * | 6/2002 | Yamada et al. | 430/270.1 |
| 6,514,666 | B1 * | 2/2003 | Choi et al. | 430/270.1 |
| 6,824,957 | B2 | 11/2004 | Okino et al. | |
| 7,163,781 | B2 | 1/2007 | Okino et al. | |
| 7,718,344 | B2 * | 5/2010 | Kamimura et al. | 430/270.1 |

OTHER PUBLICATIONS

Dean, Kim R. et al., "An analysis of EUV resist outgassing measurements", Advances in Resist Materials andProcessing Technology XXIV, Proc. of SPIE vol. 6519, (2007) pp. 65191P1-65191P7.

Domke, Wolf-Dieter et al., "Comparison of Resist Outgassing at Wavelengths from 193nm to 13nm", Advances in Resist Technology and Processing XXII, (SPIE, Bellingham, WA 2005) Proceedings of SPIE vol. 5753 pp. 1066-1075.

Hollenshead, Jeromy et al., "Modeling radiation-induced carbon contamination of extreme ultraviolet optics", J. Vac, Sci. Technol. B 24(1), Jan./Feb. 2006, © 2006 American Vacuum Society, pp. 64-82.

Lau, Kwun-Ngai, et al, "Dendronized Polymer Organogels from Click Chemistry: A Remarkable Gelation Property Owing to Synergistic Functional-Group Binding and Dendritic Size Effects **", Document No. XP-002548453, 2008 Wiley-VCH Verlag GmbH & Co., Angew, Chem. Int. Ed. 2008, 47, pp. 6912-6916.

Okada, Takeshi, et al., "Pd-Catalyzed Polymerization of Dienes that Involves Chain-Walking Isomerization of the Growing Polymer End: Synthesis of Polymers Composed of Polymethylene and Five-Membered-Ring Units **", Document No. XP-002548454, 2007 Wiley-VCH Verlag GmbH & Co., Angew. Chem. Int. Ed. 2007, 46, pp. 6141-6143.

Onishi, Yasunobu, et al., "Acid Catalyzed Resist for KrF Excimer Laser Lithography", Journal of Photopolymer Science and Technolgy, vol. 4, No. 3 (1991), pp. 337-340.

Reichmanis, E. et al., "Chemical Amplification Mechanisms for Microlithography", © 1991 American Chemical ociety, Chem. Mater. 1991, 3, pp. 394-407.

Trost, Barry M. et al., "Bromomalonates as Synthetic Reagents. Transfer Alkylations", Document No. XP-002548455; Journal of the American Cehmical Society, 98:5, Mar. 3, 1976, pp. 1204-1212.

Wallraff, G.M. et al., "Sub-50 nm half-pitch maging with a low activation energy chemically amplified photoresist", J. Vac. Sci. Technol. B 22(6), Nov./Dec. 2004, © 2004 American Vacuum Society, pp. 3479-3484.

International Search Report for Application PCT/EP2009/059160, mailing Date Oct. 20, 2009, 11 pages.

* cited by examiner

LOW OUTGASSING PHOTORESIST COMPOSITIONS

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND

The invention relates to photoresist polymers and photoresist compositions including the polymers. In particular, the invention relates to polymers and photoresist compositions suitable for photolithography processing wherein the polymers include repeating units based on derivatives of Meldrum's acid (i.e., 2,2-dimethyl-1,3-dioxane-4,6-dione).

According to the International Technology Roadmap for Semiconductors (ITRS) 2006 Update, EUV lithography is the leading candidate for 32 nm half-pitch device manufacturing. Even though the current lack of progress in tool and resist availability has cast doubt on this assertion, EUV is still considered as one of the candidates for this generation of lithography. One of the concerns of EUV resists is outgassing, which can contaminate the optics when the resist is irradiated with highly energetic EUV radiation under vacuum. It has been demonstrated that EUV outgassing is higher than outgassing at 193 nm and 157 nm for a particular resist (W. D. Domke et al., Proc. SPIE 5753, 1066, 2005). SEMATECH has set an outgassing limit of 6.5E+14 molecules/cm$^2$/sec for resists that can be used in the currently available prototype EUV tools (K. R. Dean et al., Proc. SPIE, 6519, 65191P-1, 2006). When high volume manufacturing (HVM) tools become available, the limiting value is expected to be revised downward. Previous studies also have shown that most of the outgassed species in chemically amplified resists come from the acid-catalyzed cleavage of the protecting groups and the decomposition products of the photo-acid generator (PAG) (M. M. Chauhan and P. J. Nealey, J. Vac. Sci. Technol. B, 18(6), 3402, 2000). Recent reports, however, have suggested that the light hydrocarbons (<~100 amu) in the outgassed mixture pose a negligible risk to EUV optics (J. Hollenshead et al., J. Vac. Sci. Technol. B 24(1), 64, 2006).

Therefore, it is desirable to control the outgassing of the photoresist polymer as well as the photo-acid generator (PAG) in order to satisfy the outgassing requirements of the resists.

In chemically amplified resists, to achieve higher resolution in the sub-50 nm regime, low activation energy (low Ea) protecting groups are preferred (G. M. Wallraff et al., J. Vac. Sci. Technol. B 22(6), 3479, 2004.). However, it is generally believed that low activation energy protecting groups will give a higher amount of outgassing during exposure. Therefore, acetal and/or ketal protecting groups, considered to be low activation energy protecting groups, are also expected to give higher amount of outgassing. However, in the absence of moisture, acetal and/or ketal protecting groups will not deprotect even in the presence of photo-acid. This has been demonstrated by the investigation of kinetics of deprotection and by outgassing studies done under electron beam and 248 nm exposure conditions in the absence of moisture (G. M. Wallraff et al., J. Vac. Sci. Technol. B 22(6), 3479, 2004.). Acetal and/or ketal resists are not widely used today in the industry because most of them lack storage stability.

SUMMARY

The shortcomings of the prior art are overcome and additional advantages are provided through the provision of polymer that include repeat units based on a derivative of Meldrum's acid.

In various embodiment, polymers suitable for use in photoresist compositions for advanced lithographic applications such as EUV, VUV E-Beam, or like applications include repeat units based on the derivative of Meldrum's acid (i.e., 2,2-dimethyl-1,3-dioxane-4,6-dione) shown below:

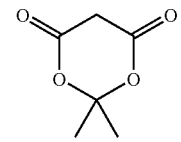

Meldrum's acid includes lactone as well as a ketal functionality. When polymers that include repeat units based on the derivative of Meldrums's acid are used in chemically amplified resist formulations, the Meldrum's acid will act as the switching group. At elevated temperatures, in the presence of photo-acid (produced during exposure) and moisture, the Meldrum's acid group will produce a dicarboxylic acid and acetone. This will make the resist film, initially insoluble, soluble in the basic developer. The derivatives of Meldrum's acid, however, are more hydrolytically stable than the usual acetal and/or ketals used in prior resist formulations and therefore are expected to have better storage stability. Further, as the deprotection reaction of the Meldrum's acid derivatives requires a stoichiometric amount of water, no reaction is expected to occur during exposure under the vacuum conditions of EUV and E-beam tools. Even if there is some reaction due to residual water vapor in the chamber, the only material that will be liberated is acetone in very small quantities.

In one embodiment, a polymer comprises a repeat unit having a formula of:

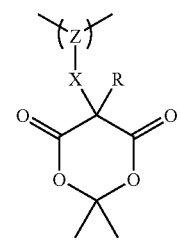

wherein Z represents a repeat unit of a polymer backbone; X is a linking group selected from the group consisting of alkylene, arylene, araalkylene, carbonyl, carboxyl, carboxyalkylene, oxy, oxyalkylene, and combinations thereof, and R is selected from the group consisting of hydrogen, alkyl, aryl, and cycloalkyl groups with the proviso that X and R are not part of the same ring system.

In another embodiment, a photoresist composition comprises a polymer comprising a repeat unit having a formula of:

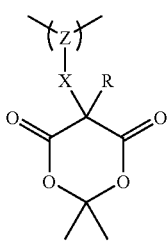

wherein Z represents a repeat unit of a polymer backbone; X is a linking group selected from the group consisting of alkylene, arylene, araalkylene, carbonyl, carboxyl, carboxyalkylene, oxy, oxyalkylene, or a combination thereof, and R is selected from the group consisting of hydrogen, alkyl, aryl, and cycloalkyl groups with the proviso that X and R are not part of the same ring system; a photo-acid generator; and a solvent.

In still another embodiment, a process for forming a relief image in a photoresist film comprises applying a photoresist composition onto a substrate to form the photoresist film, wherein the photoresist composition comprises a polymer comprising a repeat unit having a formula of:

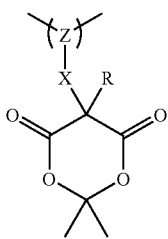

wherein Z represents a repeat unit of a polymer backbone; X is a linking group selected from the group consisting of alkylene, arylene, araalkylene, carbonyl, carboxyl, carboxyalkylene, oxy, oxyalkylene, and combinations thereof, and R is selected from the group consisting of hydrogen, alkyl, aryl, and cycloalkyl groups with the proviso that X and R are not part of the same ring system, a photo-acid generator, and a solvent; exposing the film to radiation using a radiation source; and developing the photoresist film to form the relief image.

As a result of the summarized invention, technically we have identified polymers, photoresist compositions, and methods of lithographically processing the same that are amenable to advanced lithographic applications such as EUV or VUV lithography. In the presence of a photo-acid and moisture, the initially insoluble polymer becomes soluble when developed in an aqueous base as a result of hydrolysis of the ketal functionality. Acetone is a volatile byproduct of the hydrolysis reaction.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
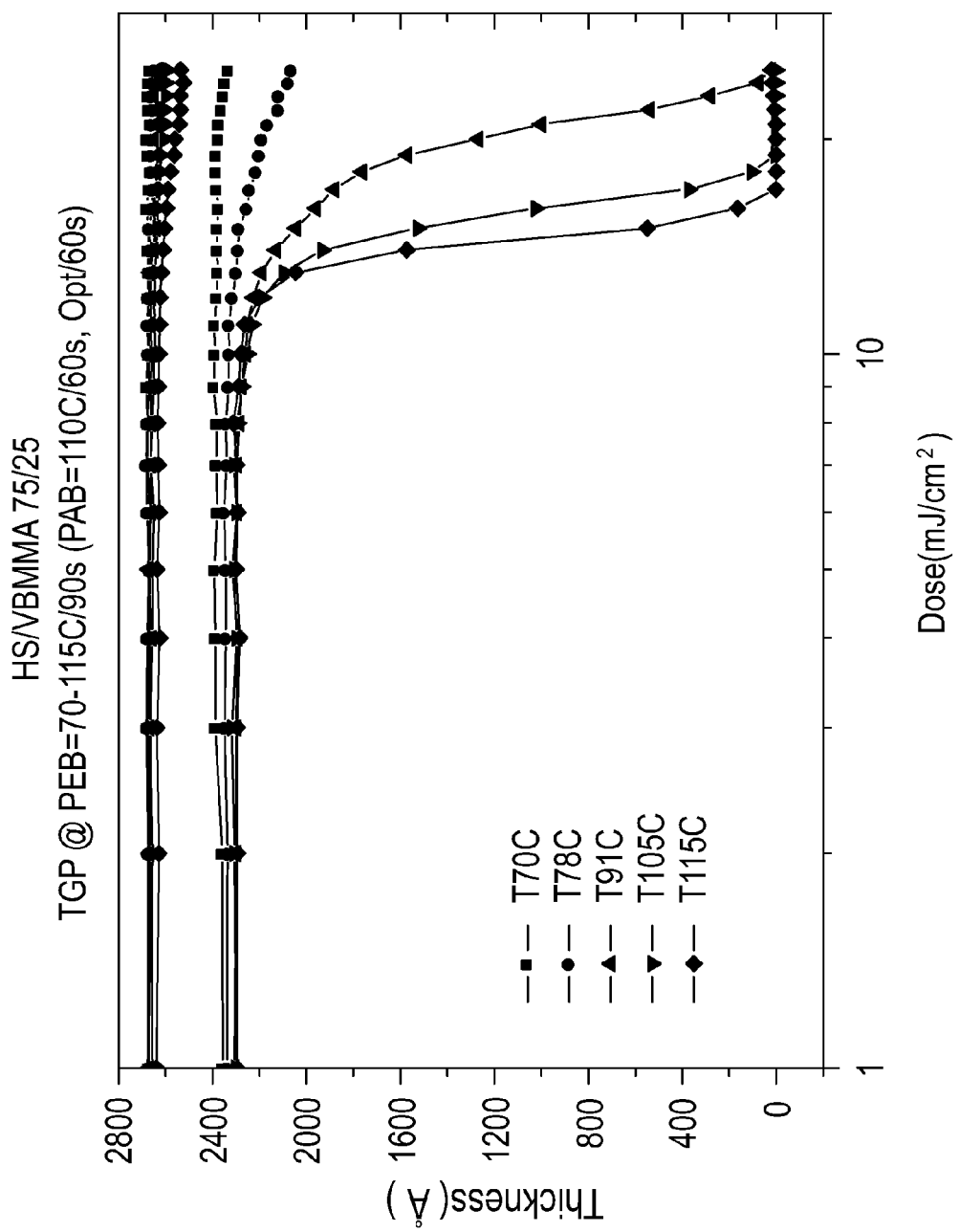
FIG. 1 graphically illustrates contrast curves at various post exposure bake temperatures for a photoresist composition prepared in accordance with the present invention.

The detailed description explains the preferred embodiments of the invention, together with advantages and features, by way of example with reference to the drawings.

DETAILED DESCRIPTION

Before describing the present invention in detail, it is to be understood that unless otherwise indicated this invention is not limited to specific compositions, components, or process steps, as such may vary. It is also to be understood that the terminology used herein is for the purpose of describing particular embodiments only, and is not intended to be limiting.

It must be noted that, as used in this specification and the appended claims, the singular forms "a," "an," and "the" include plural referents unless the context clearly dictates otherwise. Thus, for example, reference to "a monomer" includes not only a single monomer but also a combination or mixture of two or more monomers that may or may not be the same, a "photo-acid generator" includes a combination or mixture of two or more photo-acid generators as well as a single photo-acid generator, and the like.

In describing and claiming the present invention, the following terminology will be used in accordance with the definitions set out below.

The term "alkyl" as used herein refers to a branched or unbranched saturated hydrocarbon group of 1 to 24 carbon atoms, preferably 1 to 12 carbon atoms, such as methyl, ethyl, n-propyl, isopropyl, n-butyl, isobutyl, t-butyl, octyl, decyl, tetradecyl, hexadecyl, eicosyl, tetracosyl, and the like, as well as cycloalkyl groups such as cyclopentyl, cyclohexyl, and the like.

The term "alkylene" as used herein refers to a difunctional saturated branched or unbranched hydrocarbon chain containing from 1 to 24 carbon atoms, preferably 1 to 12 carbon atoms, and includes, for example, methylene (—CH2-), ethylene (—CH2-CH$_2$—), propylene (—CH$_2$—CH$_2$CH$_2$—), 2-methylpropylene (—CH$_2$—CH(CH$_3$)—CH$_2$—), hexylene (—(CH$_2$)$_6$—), cycloalkylene and the like.

The term "aryl" as used herein, and unless otherwise specified, refers to an aromatic moiety containing 1 to 5 aromatic rings. For aryl groups containing more than one aromatic ring, the rings may be fused or linked. Aryl groups are optionally substituted with one or more inert, nonhydrogen substituents per ring; suitable inert, nonhydrogen substituents include, for example, halo, haloalkyl (preferably halo-substituted lower alkyl), alkyl (preferably lower alkyl), alkoxy (preferably lower alkoxy), and the like. Unless otherwise indicated, the term "aryl" is also intended to include heteroaromatic moieties, i.e., aromatic heterocycles. Generally, although not necessarily, the heteroatoms will be nitrogen, oxygen, or sulfur.

The term "polymer" is used to refer to a chemical compound that comprises linked monomers and that may be linear, branched, or crosslinked. The polymer may be a homopolymer or a copolymer.

The terms "photogenerated acid" and "photo-acid" are used interchangeably herein to refer to the acid that is created upon exposure of the present compositions to radiation, i.e., as a result of the radiation sensitive photo-acid generator in the compositions.

Disclosed herein are polymers suitable for use in photoresist compositions as well as processes for photolithographically processing the photoresist composition. The polymer includes repeating units of a monomer based on a derivative of Meldrum's acid (i.e., 2,2-dimethyl-1,3-dioxane-4,6-dione) as shown in Formula (I) below, which includes both lactone and ketal functionalities.

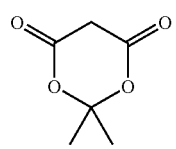

(I)

When polymers are formed that include repeat units based on the derivative of Meldrums's acid are used in chemically amplified photoresist formulations, the lactone and ketal functionalities provided by the derivative of Meldrum's acid will act as the switching group. At elevated temperatures in the presence of a photo-acid (produced during exposure) and moisture, the Meldrum's acid group will produce a dicarboxylic acid and acetone. This will make the photoresist film, initially insoluble, soluble in a basic developer. The derivatives of Meldrum's acid, however, have been discovered to be more hydrolytically stable than the usual acetals and/or ketals used in current low energy photoresist formulations and therefore are expected to have better storage stability. Furthermore, as the deprotection reaction of the Meldrum's acid derivatives requires a stoichiometric amount of water, no reaction is expected to occur during exposure under the vacuum conditions of EUV and E-beam lithographic processing tools. Even if there is some reaction due to residual water vapor in the chamber, the only material that will be liberated is acetone in very small quantities.

In one embodiment, the polymer includes one or more repeat units based on a derivative of Meldrum's acid as shown by the following formula (II):

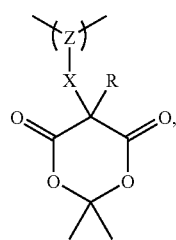

(II)

wherein Z represents a repeat unit of a polymer backbone; X is a linking group selected from the group consisting of alkylene, arylene, araalkylene, carbonyl, carboxyl, carboxyalkylene, oxy, oxyalkylene, and a combination thereof, and R is selected from the group consisting of hydrogen, alkyl, aryl, and cycloalkyl groups with the proviso that X and R are not part of the same ring system.

Polymers including the repeating unit as defined in formula (II) may include co-monomers that contain aqueous base soluble groups such as phenols, fluoroalcohols and/or polar functionalities such as lactones, anhydrides, alcohol groups, sulfonamide groups, other acid labile groups and the like. The ratios of the different monomeric units are not intended to be limited. For example, Example 4 below details synthesis of a poly[4-hydroxystyrene-co-2,2-dimethyl-5-(4-vinylbenzyl)-1,3-dioxane-4,6-dione] copolymer. Although the ratio of m:n depicted in the example was 75:25 (wherein n represents the derivative of Meldrum's Acid as defined by Formula II), it should be apparent in view of this disclosure that by varying the monomer ratio one can obtain a copolymer wherein the ratio of m:n is at a ratio of greater than 0 to 99.99 mol %:0.01 to less than 100 mol %, respectively. In other embodiments, the m:n ratio is greater than 50 to less than 100 mol %:greater than 0 to less than 50 mol %, respectively. In still other embodiments, the m:n ratio is greater than 60 to less than 90 mol %:greater than 10 to less than 40 mol %, respectively. Likewise, the number of different monomers is not intended to be limited. Higher order polymers such as terpolymers and the like can also be made. In one embodiment, the molecular weight is 1,000 to 100,000 Daltons, and in other embodiments, the molecular weight is 5,000 to 10,000 Daltons.

Monomers having the structure of formulae (II) may be readily synthesized using methods described in the pertinent texts and literature, or as known to those of ordinary skill in the art. Methods for synthesizing representative monomers and polymers are described in the Examples.

For example, copolymers that include a repeat unit having the structure of formula (II) may be prepared by radical copolymerization using a suitable free radical initiator. Radical polymerization is easy to run, economical, and highly suited for preparation of resist polymers. The initiator may be any conventional free radical-generating polymerization initiator. Examples of suitable initiators include peroxides such as O-t-amyl-O-(2ethylhexyl)monoperoxycarbonate, dipropylperoxydicarbonate, and benzoyl peroxide (BPO), as well as azo compounds such as azobisisobutyronitrile (AIBN), 2,2'-azobis(2-amidino-propane)dihydro chloride, and 2,2'-azobis (isobutyramide) dihydrate. The initiator is generally present in the polymerization mixture in an amount of from about 0.2 to 20 mol % relative to the monomers.

The polymers can be characterized by Gel Permeation Chromatography (GPC), Thermo Gravimetric Analysis (TGA), Differential Scanning Calorimetry (DSC), and Nuclear Magnetic Resonance spectroscopy (NMR).

The present invention also provides a photoresist composition comprising a photoresist polymer that includes repeat units of Formula (II), a photo-acid generator, and an organic solvent.

A variety of photo-acid generators can be used in the composition of the present invention. The photosensitive acid generators used in the photoresist compositions may be any suitable photosensitive acid generator known in the photoresist art that is compatible with the other components of the photoresist composition. Examples of preferred photoresist acid generators (PAGs) include: α-(trifluoromethylsulfonyloxy)-bicyclo[2.2.1]hept-5-ene-2,3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,731,605. Also, a PAG that produces a weaker acid such as dodecane sulfonate of N-hydroxy-naphthalimide (DDSN) may be used. Combinations of PAGs may be used as well.

Generally, suitable acid generators have a high thermal stability (typically to temperatures greater than 140° C.) so they are not degraded during pre-exposure processing. In addition to MDT and DDSN, other suitable PAGs include other sulfonate salts as well as sulfonated esters and sulfonyloxy ketones. See U.S. Pat. No. 5,344,742 to Sinta et al. and *J. Photopolymer Science and Technology* 4:337-340 (1991) for disclosure of suitable sulfonate PAGs, including benzoin tosylate, t-butylphenyl α-(p-toluenesulfonyloxy)-acetate, and t-butyl α-(p-toluenesulfonyloxy)-acetate.

Onium salts are also generally preferred acid generators of compositions of the invention. Onium salts that contain weakly nucleophilic anions have been found to be particularly suitable. Examples of such anions are the halogen complex anions of divalent to heptavalent metals or nonmetals, for example, Sb, B, P, and As. Examples of suitable onium salts are aryl-diazonium salts, halonium salts, aromatic sulfonium, salts and sulfoxonium salts or selenium salts (e.g., triarylsulfonium and diaryliodonium hexafluoroantimonates, hexafluoroarsenates, and trifluoromethanesulfonates). Examples of preferred onium salts can be found in U.S. Pat. Nos. 4,442,197, 4,603,101, and 4,624,912.

Other useful acid generators include the family of nitrobenzyl esters and the s-triazine derivatives. Suitable s-triazine acid generators are disclosed, for example, in U.S. Pat. No. 4,189,323.

Still other suitable acid generators include, but are not limited to, N-camphorsulfonyloxynaphthalimide; N-pentafluorophenylsulfonyloxynaphthalimide, ionic iodonium sulfonates (e.g., diaryl iodonium (alkyl or aryl) sulfonate and bis-(di-t-butylphenyl)iodonium camphanylsulfonate); ionic iodonium perfluoroalkanesulfonates (such as di-(4-t-butylphenyl)iodonium pentafluorooctane sulfonate, "IPFOS"), aryl (e.g., phenyl or benzyl) triflates and derivatives and analogs thereof (e.g., triphenylsulfonium triflate or bis-(t-butylphenyl)iodonium triflate), pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, and alkyl disulfones.

Other suitable photo-acid generators are disclosed in Reichmanis et al. (1991), *Chemistry of* Materials 3:395, and in U.S. Pat. No. 5,679,495 to Yamachika et al. Additional suitable acid generators useful in conjunction with the compositions and methods of the invention will be known to those skilled in the art and/or are described in the pertinent literature.

The choice of solvent is governed by many factors and is not limited to the solubility and miscibility of resist components, the coating process, and safety and environmental regulations. Additionally, inertness to other resist components is desirable. It is also desirable that the solvent possess the appropriate volatility to allow uniform coating of films, yet also allow significant reduction or complete removal of residual solvent during the post-application bake process. See, e.g., Introduction to Microlithography, Eds. Thompson et al., cited previously. In addition to the above components, the photoresist compositions of the invention generally include a casting solvent to dissolve the other components so that the overall composition may be applied evenly on the substrate surface to provide a defect-free coating. Where the photoresist composition is used in a multilayer imaging process, the solvent used in the imaging layer photoresist is preferably not a solvent to the underlayer materials; otherwise the unwanted intermixing may occur. Examples of suitable casting solvents include: ethoxyethylpropionate (EEP); a combination of EEP and γ-butyrolactone (GBL); PGMEA; and ethyl lactate. The invention is not limited to selection of any particular solvent. Solvents may generally be chosen from ether-, ester-, hydroxyl-, and ketone-containing compounds, or mixtures of these compounds. Examples of appropriate solvents include: cyclopentanone; cyclohexanone; lactate esters, such as ethyl lactate; alkylene glycol alkyl ether esters, such as propylene glycol methyl ether acetate; alkylene glycol monoalkyl esters, such as methyl cellosolve; butyl acetate; 2-ethoxyethanol; and ethyl 3-ethoxypropionate. Preferred solvents include PGMEA, EEP, and their mixtures.

The above list of solvents is for illustrative purposes only and should not be viewed as being comprehensive, nor should the choice of solvent be viewed as limiting to the invention in any way. Those skilled in the art will recognize that any number of solvents or solvent mixtures may be used. Greater than 50 percent of the total mass of the resist formulation is typically composed of the solvent, preferably greater than 80 percent.

The photoresist polymer represents up to about 99 wt. % of the solids included in the composition, and the photo-acid generator represents approximately 0.5-10 wt. % of the solids contained in the composition. Other components and additives may also be present.

For example, a positive photoresist composition may include a dissolution inhibitor; and a negative photoresist composition will include a crosslinking agent. If dissolution inhibitors and crosslinking agents are present, they will typically be present in the range of about 1 wt. % to 40 wt. %, preferably about 5 wt. % to 30 wt. %, of the total solids.

Suitable dissolution inhibitors will be known to those skilled in the art and/or described in the pertinent literature. Preferred dissolution inhibitors have high solubility in both the resist composition and the solvent used to prepare solutions of the resist composition (e.g., propylene glycol methyl ether acetate, or "PGMEA"), exhibit strong dissolution inhibition, have a high exposed dissolution rate, are substantially transparent at the wavelength of interest, exhibit a moderating influence on Tg, strong etch resistance, and display good thermal stability (i.e., stability at temperatures of about 140 C. or greater). Suitable dissolution inhibitors include, but are not limited to, bisphenol A derivatives and carbonate derivatives, for example, bisphenol A derivatives wherein one or both hydroxyl moieties are converted to a t-butoxy substituent or a derivative thereof, such as a t-butoxycarbonyl or t-butoxycarbonylmethyl group; fluorinated bisphenol A derivatives such as CF3-bisphenol A-OCH2(CO)—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; cyclic acetal groups such as tetrahydrofuranyl, tetrahydropyranyl, and 2-methoxytetrahydropyranyl groups; and androstane-17-alkylcarboxylates and analogs thereof, wherein the 17-alkylcarboxylate at the 17-position is typically lower alkyl. Examples of such compounds include lower alkyl esters of cholic, ursocholic, and lithocholic acid, including methyl cholate, methyl lithocholate, methyl ursocholate, t-butyl cholate, t-butyl lithocholate, t-butyl ursocholate, and the like (see, e.g., Allen et al. (1995) J. Photopolym. Sci. Technol., cited supra); hydroxyl-substituted analogs of such compounds (ibid.); and androstane-17-alkylcarboxylates substituted with one to three $C_1$-$C_4$ fluoroalkyl carbonyloxy substituents such as t-butyl trifluoroacetyllithocholate (see, e.g., U.S. Pat. No. 5,580,694 to Allen et al.).

Other customary additives include dyes that may be used to adjust the optical density of the formulated resist, and sensitizers that enhance the activity of photo-acid generators by absorbing radiation and transferring it to the photo-acid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicities may be used as stabilizers and acid-diffusion controlling additives. They may include nitrogenous compounds, such as aliphatic primary, secondary, and tertiary amines; cyclic amines such as piperidines; pyrimidines; morpholines; aromatic heterocyclics such as pyridines; pyrimidines; purines; imines such as diazabicycloundecene; guanidines; imides; amides; and others. Ammonium salts may also be used, including ammonium, primary, secondary, tertiary, and quaternary alkyl- and arylammonium salts of alkoxides (e.g., hydroxide, phenolates, carboxylates, aryl and alkyl sulfonates, sulfonamides, and others). Other cationic nitrogenous compounds, including pyridinium salts and salts of other heterocyclic nitrogenous compounds with anions such as alkoxides (e.g., hydroxide, phenolates, carboxylates, aryl and alkyl sulfonates, sulfonamides, and the like), may also be employed. Surfactants may be used to improve coating uniformity, and include a wide variety of ionic and non-ionic, monomeric, oligomeric, and polymeric species.

Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers (such as oligo- and polyethyleneglycol ethers, cycloaliphatic esters, and non-acid reactive steroidally derived materials) may be used as plasticizers if desired. Neither the classes of compounds nor the specific compounds mentioned above, however, are intended to be comprehensive and/or limiting. One versed in the art will recognize the wide spectrum of commercially available products that may be used to carry out the types of functions that these customary additives perform.

Exemplary radiation or irradiation sources which are useful for lithographically forming the photoresist pattern include, without limitation, VUV (157 nm), ArF (193 nm), KrF (248 nm), EUV (13 nm), E-beam, X-ray and ion beam. Preferably, the irradiation energy is in the range of from about 1 mJ/cm2 to about 100 mJ/cm2.

The present invention also provides a semiconductor device, which is manufactured using the photoresist composition described above.

In the following examples, unless indicated otherwise, parts are parts by weight, temperature is in ° C. and pressure is at or near atmospheric. Additionally, all starting materials were obtained commercially or were synthesized using known procedures. 4-(2-hydroxyhexafluoro-2-propyl)styrene monomer was obtained from Central Glass Company.

Where appropriate, the following techniques and equipment were utilized in the Examples: 1H and 13C NMR spectra were obtained at room temperature on an Avance 400 spectrometer. Quantitative 13C NMR was run at room temperature in acetone-d6 in an inverse-gated 1H-decoupled mode using Cr(acac)3 as a relaxation agent on an Avance 400 spectrometer. For polymer composition analysis 19F NMR (379 MHz) spectra were also obtained using a Bruker Avance 400 spectrometer. Thermo-gravimetric analysis (TGA) was performed at a heating rate of 5° C./min in N2 on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Nanometrics Inc. NanoSpec 6100 or Tencor alpha-step 2000. A quartz crystal microbalance (QCM) was used to study the dissolution kinetics of the resist films in an aqueous tetramethylammonium hydroxide (TMAH) solution (CD-26).

193 nm exposures were carried out on an ISI mini-stepper with 0.60 NA. 248 nm exposures were carried out on an ASML 0.60 NA stepper. E-beam exposures were carried out on a Leica 100 kV exposure tool. EUV exposures were carried out on a prototype EUV tool at Lawrence Berkeley National Laboratory in Berkeley, Calif.

The following examples are presented for illustrative purposes only, and are not intended to limit the scope of the invention. Efforts have been made to ensure accuracy with respect to numbers (e.g., amounts, temperature, etc.), but allowance should be made for the possibility of errors and deviations Example 1

Synthesis of 2,2-dimethyl-5-(4-vinylbenzyl)-1,3-dioxane-4,6-dione (VBMMA)

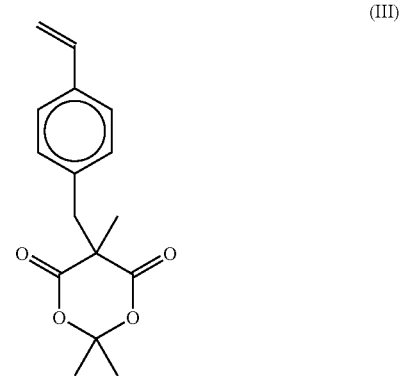

(III)

To a 500 mL 3-necked round bottomed flask equipped with a stir bar, thermowell, and a condenser connected to a nitrogen line was added 10.0 g (0.0632 mole) of 2,2,5-trimethyl-1,3-dioxane-4,6-dione, 10.6 g (0.0632 mol) of p-(chloromethyl)styrene, 35 g (0.2528 mol) of potassium carbonate and 200 mL of acetone. Approximately 1 g of phenothiazine was added as a stabilizer. The mixture was refluxed with stirring overnight at which time it was allowed to cool, diluted with 200 mL of ethyl acetate and filtered through a bed of Celite. The filtrate was washed with water and brine and dried overnight over anhydrous sodium sulfate. The suspension was filtered and the filtrate evaporated on a rotary evaporator to a light brown oil which spontaneously crystallized. The crystals were collected and washed with 35-65 petroleum ether to yield 3.5 g of 2,2-dimethyl-5-(4-vinylbenzyl)-1,3-dioxane-4,6-dione as shown by formula (III).

Example 2

Synthesis of 2,2-dimethyl-5-allyl-1,3-dioxane-4,6-dione (ALMMA)

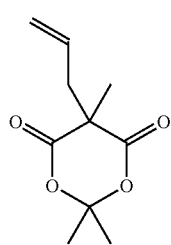
(IV)

To a 500 mL 3-necked round bottomed flask equipped with a stir bar, thermowell and a condenser connected to a nitrogen line was added 10.0 g (0.0632 mole) of 2,2,5-trimethyl-1,3-dioxane-4,6-dione, 7.7 g (0.0632 mol) of allyl bromide, 21 g (0.152 mol) of potassium carbonate and 200 mL of acetone. The mixture was refluxed with stirring overnight at which time it was allowed to cool, diluted with 200 mL of ethyl ether and filtered through a bed of Celite/activated charcoal. The filtrate was washed with water and brine and dried overnight over anhydrous sodium sulfate. The suspension was filtered and the filtrate evaporated on a rotary evaporator to yield 11 g of 2,2-dimethyl-5-allyl-1,3-dioxane-4,6-dione compound as shown in Formula (IV)) as a clear, colorless oil.

Example 3

Synthesis of 4-(2,2-dimethyl-4,6-dioxo-[1,3]-dioxan-5-yl)-butyric acid 2-(2-methyl-acryloyloxy)-ethyl ester

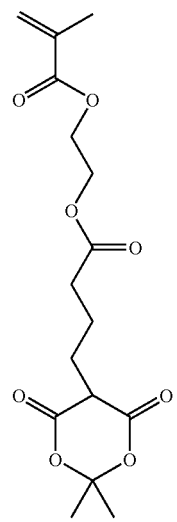
(V)

Mono(2-methylacryloyloxy)ethyl succinate (3.9 mL, 20 mmol), Meldrum's acid (3.20 g, 22 mmol), 4-dimethylaminopyridine (3.85 g, 32 mmol) and phenothiazine (46 mg) were dissolved in dichloromethane (100 mL) in a 250 mL 3-necked round bottomed flask equipped with a thermometer, nitrogen/vacuum inlet, and an addition flask containing a solution of dicyclohexylcarbodiimide (DCC) (4.74 g, 23 mmol) in dichloromethane (50 mL). The system was deoxygenated with nitrogen, the reaction flask was cooled in acid/acetone, and the DCC solution was added over a period of 1 hr. The reaction proceeded in the cooling bath overnight. A white precipitate was filtered off. The filtrate was washed with 10% aqueous KHSO4 (100 mL×3) and brine (100 mL), dried over MgSO4, filtered, and the 4-(2,2-dimethyl-4,6-dioxo-[1,3]dioxin-5-ylidene)-4-hydroxy-butyric acid 2-2-methyl-acryloyloxy)-ethyl ester solution was used directly for the acetoxyborohydride reduction.

The 4-(2,2-dimethyl-4,6-dioxo-[1,3]dioxin-5-ylidene)-4-hydroxy-butyric acid 2-2-methyl-acryloyloxy)-ethyl ester solution was cooled in an ice/acetone bath and acetic acid (13.5 mL) was added. Sodium borohydride (NaBH4) (1.85 g, 50 mmol) was then added over a period of 1 hr. The reaction was kept in the cooling bath overnight, washed with brine (100 mL×2) and water (100 mL×2), dried over MgSO4, and filtered. Another portion of phenothiazine (46 mg) was added, the solution was concentrated under vacuum, taken up in ethyl acetate, filtered, and recrystallized by the addition of hexanes to yield 3.91 g pale yellow solid in 2 lots (57% yield) of 4-(2,2-dimethyl-4,6-dioxo-[1,3]-dioxan-5-yl)-butyric acid 2-(2-methyl-acryloyloxy)-ethyl ester as shown in Formula (V) above.

Example 4

Synthesis of poly[4-hydroxystyrene-co-2,2-dimethyl-5-(4-vinylbenzyl)-1,3-dioxane-4,6-dione]; Poly (4HS-co-VBMMA) (75:25)

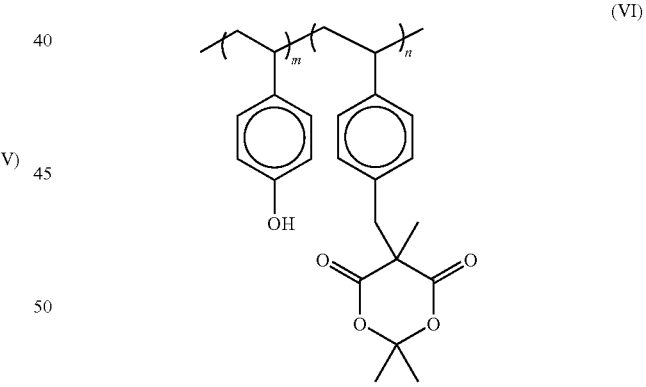
(VI)

4-Hydroxystyrene (2.50 g of 72% solution in tetrahydrofuran, 0.015 mole), 2,2-Dimethyl-5-(4-vinylbenzyl)-1,3-dioxane-4,6-dione (VBMMA) (1.37 grams, 0.005 mole) and 8.9 grams of tetrahydrofuran were placed in a round bottom flask equipped with a condenser and a nitrogen inlet. 2,2'-Azobisisobutyronitrile (AIBN) (0.131 grams, 0.0008 mole) was added to this solution and stirred until dissolved. Then, the solution was degassed using four vacuum/nitrogen purges. The contents were then heated to reflux for 18 hours. Afterwards, the solution was added drop wise into hexanes (300 ml). The precipitated polymer was filtered (frit), washed twice with hexanes (50 ml) and suction dried for 3 hours. This polymer was then reprecipitated two times from acetone into DI water and HFE-7100 respectively. The final polymer was dried under vacuum at 500 C. Yield: 1.86 grams. Mw=6,508; PDI=1.58

Example 5

Synthesis of poly[4-(2-hydroxyhexafluoro-2-propyl)styrene-co-2,2-dimethyl-5-(4-vinylbenzyl)-1,3-dioxane-4,6-dione]; Poly(4HFA-ST-co-VBMMA) (65:35)

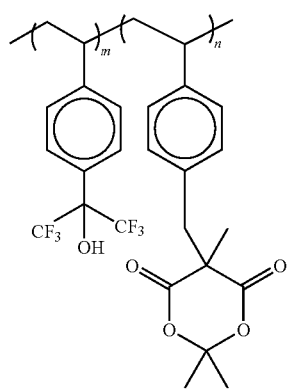

(VII)

4-(2-hydroxyhexafluoro-2-propyl)styrene (4HFA-ST) (1.40 g, 0.0052 mole), 2,2-Dimethyl-5-(4-vinylbenzyl)-1,3-dioxane-4,6-dione (VBMMA) (0.77 g, 0.0028 mole) and 6.6 grams of tetrahydrofuran were placed in a round bottom flask equipped with a condenser and a nitrogen inlet. 2,2'-azobisisobutyronitrile (AIBN) (0.052 g, 0.00032 mole) and 1-dodecanethiol (0.048 g, 0.00024 mole) were added to this solution and stirred until dissolved. Then, the solution was degassed using four vacuum/nitrogen purges. The contents were then heated to reflux for 18 hours. Afterwards, the solution was added drop wise into hexanes (200 ml). The precipitated polymer was filtered (frit), washed twice with hexanes (50 ml) and the polymer was dried under vacuum at 500 C. Yield: 1.58 grams. Mw=10,480; PDI=1.84.

Example 6

A Photoresist Composition Based on Poly(4HS-co-VBMMA) (75:25)

1.0 g of the polymer as prepared in accordance with Example 4, 50 mg of a mixture of two sulfonium photo-acid generators (PAG), and 3.3 mg of an organic base were dissolved in 7.3 g of propylene glycol monomethyl ether acetate (PGMEA). This solution was filtered through a 0.2 micrometer syringe filter.

The photoresist composition of Example 6 was spin coated onto multiple silicon wafers using a post apply bake temperature was 110° C. for 60 seconds. FIG. 1 graphically illustrates contrast curves for the photoresist composition at various post exposure temperatures for 90 seconds. Thickness as a function of exposure dose was measured for the different post exposed bake temperatures.

Figure 2:
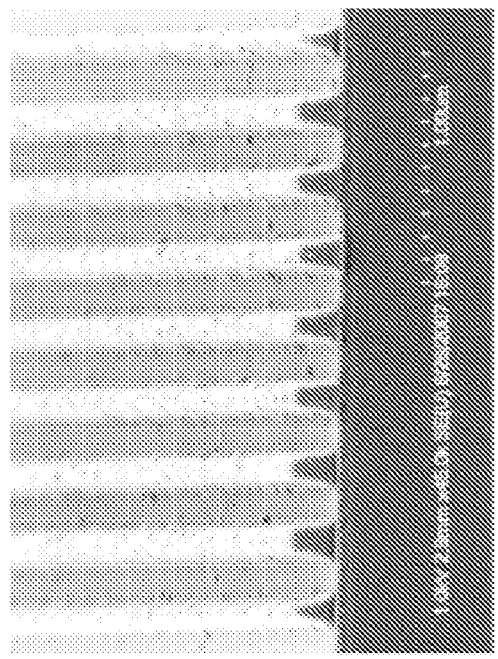
FIG. 2 illustrates scanning electron micrographs of a patterned photoresist composition prepared in accordance with the present invention and imaged on a 248 nm exposure tool.
Figure 2:
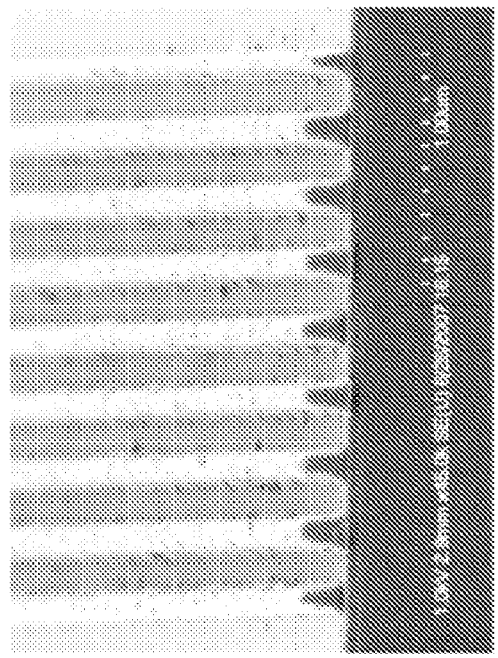

In addition, the photoresist composition of Example 6 was spin coated onto a silicon wafer coated with 62 nm of an anti reflection coating (Brewer Science DUV-42P) at a thickness of 267 nm and imaged using an ASML 248-nm Stepper, 0.60 NA. The photoresist composition was post apply baked at 110° C. for 60 seconds, post exposure baked at 108° C. for 60 seconds, and developed in a 0.26 N aqueous TMAH solution. FIG. 2 illustrates scanning electron micrographs of a 1:1 line space pairs for the patterned photoresist composition at 150 nm and 160 nm feature sizes.

Example 7

A Photoresist Composition Based on Poly(4HS-co-VBMMA) (75:25) for EUV Exposure 0.25 g of the polymer prepared in accordance with Example 4, 15.0 mg of a mixture of two sulfonium photo-acid generators (PAG), and 0.825 mg of an organic base were dissolved in 4.1 g of PGMEA. This solution was filtered through a 0.2 micrometer syringe filter.

Outgassing of the photoresist composition was analyzed during EUV exposure. The experiment was carried out at the EUV Resist Test Center at SEMATECH-North at the University at Albany. A resist film having a thickness of 100 nm was exposed to 56 mJ/cm2 (2×E0) of EUV radiation from a stand-alone EUV source. It was baked at 100° C. for 60 seconds. The outgassing rate was determined by summing the masses of interest as determined by quadrupole mass spectrometry (QMS). The value obtained for this resist was 2.04E+14 molecules/cm2/s. This is less than the limit set by SEMATECH at 6.5E+14 molecules/cm2/s.

Figure 3:
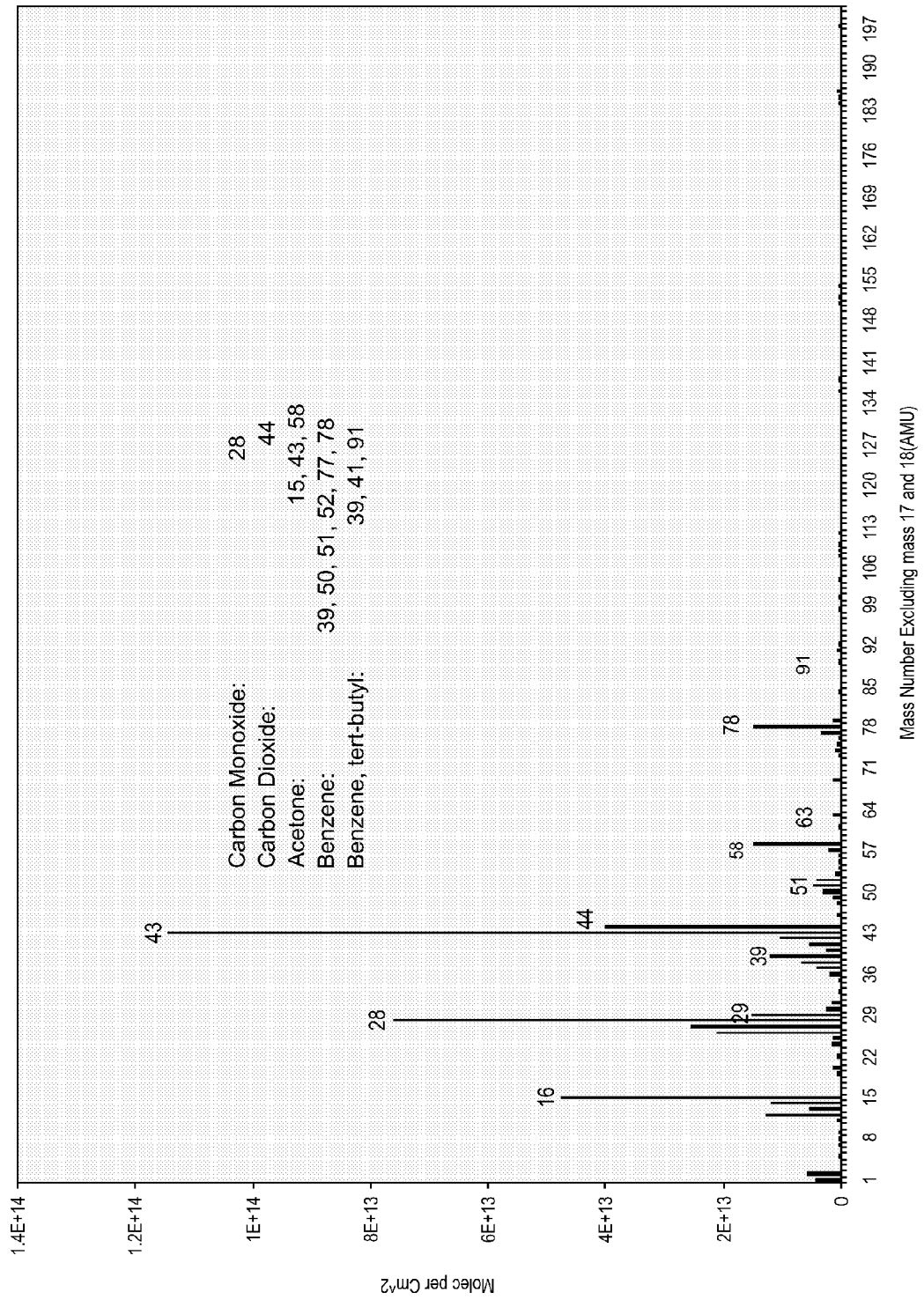
FIG. 3 graphically illustrates a mass spectrum of outgassing molecules during EUV exposure of a photoresist composition prepared in accordance with the present invention.

FIG. 3 graphically illustrates the mass spectrum presented, which clearly indicates that there are no fragments other than acetone emanating from the polymer. All the other fragments can be attributed to the photo-acid generator.

Figure 4:
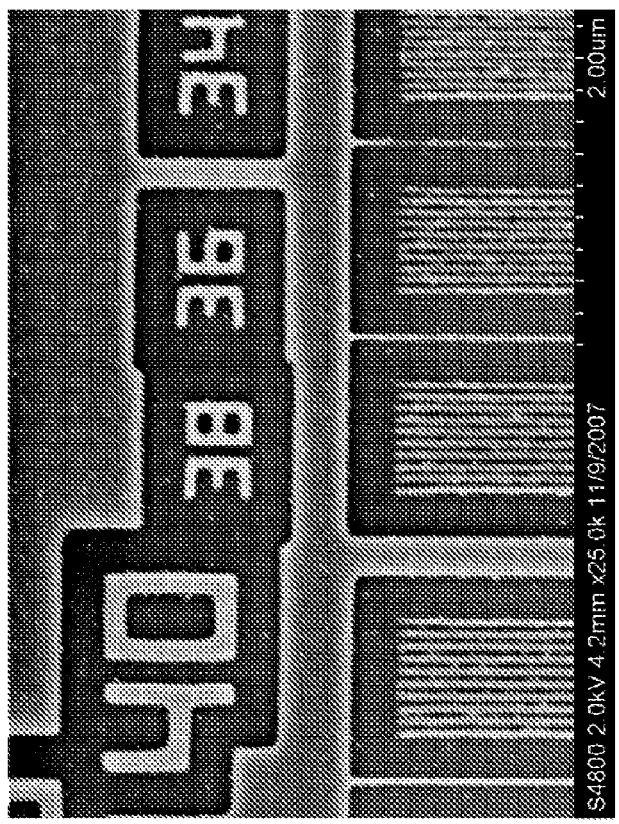
FIG. 4 illustrates scanning electron micrographs of a patterned photoresist composition prepared in accordance with the present invention and imaged on an EUV exposure tool.
Figure 4:
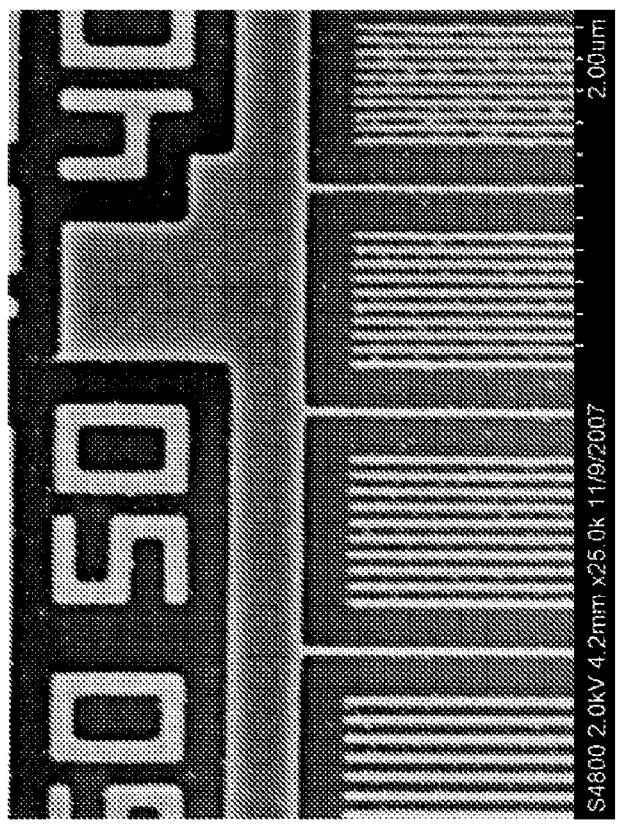

FIG. 4 illustrates scanning electron micrographs of the patterned photoresist composition. The photoresist composition analogous to Example 7 was spin coated onto a silicon wafer already coated with 62 nm of an anti reflection coating (Brewer Science DUV-42P) at a thickness of 105 nm and imaged using an EUV prototype tool at an exposure does of 67.38 mJ. The photoresist composition was post apply baked at 110° C. for 60 seconds, post exposure baked at 100° C. for 60 seconds, and developed for 60 seconds in an aqueous 0.26 N TMAH solution.

The polymers herein advantageously enjoy the following properties:

a.) the protecting groups do not deprotect inside the imaging tool under vacuum conditions;

b.) if deprotected while being exposed, the fragments are attached to the polymer in some fashion so that they don't outgas; and c.) the fragments are light hydrocarbons with molecular weight <100 atomic mass units (amu).

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A polymer comprising a repeat unit having a formula of:

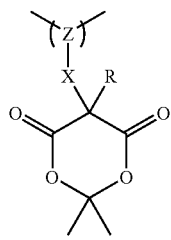

wherein Z represents a repeat unit of a polymer backbone; X is a linking group selected from the group consisting of alkylene, arylene, araalkylene, carbonyl, carboxyl, carboxyalkylene, oxy, oxyalkylene, and combinations thereof, and R is selected from the group consisting of hydrogen, alkyl, aryl, and cycloalkyl groups with the proviso that X and R are not part of the same ring system.

2. The polymer of claim 1, further comprising at least one additional repeat unit having one or more functionalities selected from the group consisting of phenols, fluoroalcohols, lactones, anhydrides, alcohol groups, sulfonamide groups, and acid labile groups.

3. The polymer of claim 1, wherein the polymer has a molecular weight from 1000 to 100,000 Daltons.

4. The polymer of claim 1, wherein the repeat unit is

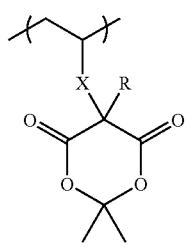 and/or 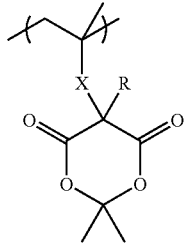.

5. The polymer of claim 1, wherein the repeat unit defines a copolymer having the formula:

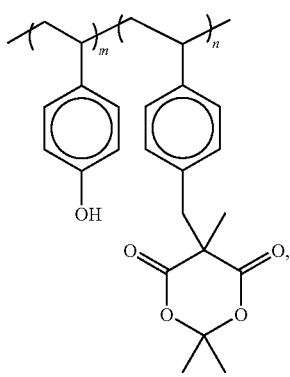

wherein m and n are at a ratio of greater than 0 to 99.99 mol %:0.01 to less than 100 mol %, respectively.

6. The polymer of claim 1, wherein the repeat unit defines a copolymer comprising:

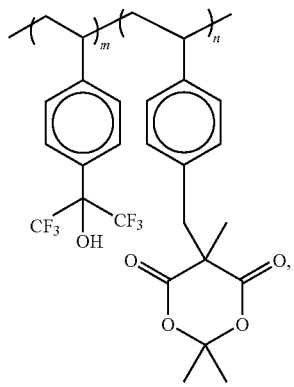

wherein m and n are at a ratio of greater than 0 to 99.99 mol %:0.01 to less than 100 mol %, respectively.

7. A photoresist composition comprising:
    a polymer comprising a repeat unit having a formula of:

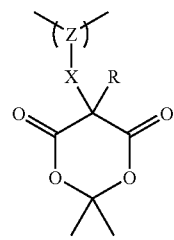

wherein Z represents a repeat unit of a polymer backbone; X is a linking group selected from the group consisting of alkylene, arylene, araalkylene, carbonyl, carboxyl, carboxyalkylene, oxy, oxyalkylene, and combinations thereof, and R is selected from the group consisting of hydrogen, alkyl, aryl, and cycloalkyl groups with the proviso that X and R are not part of the same ring system;
    a photo-acid generator; and
    a solvent.

8. The photoresist composition of claim 7, wherein the photo-acid generator is in an amount from 0.5 to 10% by weight of the polymer.

9. The photoresist composition of claim 7, wherein the repeat unit defines a copolymer having the formula:

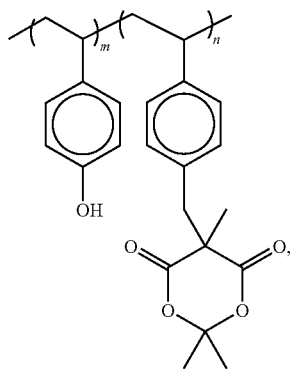

wherein m and n are at a ratio of greater than 0 to 99.99 mol %:0.01 to less than 100 mol %, respectively.

10. The photoresist composition of claim 7, wherein the repeat unit defines a copolymer comprising:

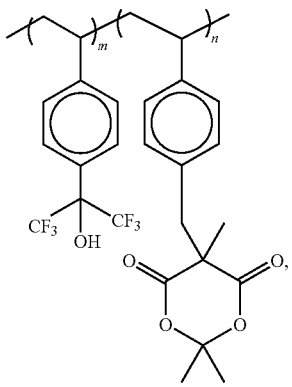

wherein m and n are at a ratio of greater than 0 to 99.99 mol %:0.01 to less than 100 mol %, respectively.

11. The photoresist composition of claim 7, wherein the repeat unit is

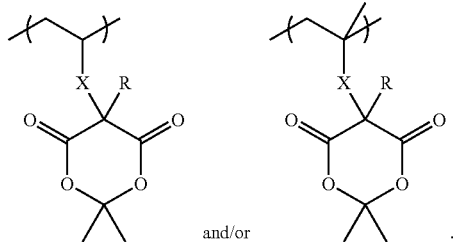

and/or.

12. The photoresist composition of claim 7, wherein the polymer has a molecular weight from 1,000 to 100,000 Daltons.

13. A process for forming a relief image in a photoresist film, comprising:
applying a photoresist composition on a substrate to form the photoresist film, wherein the photoresist composition comprises a polymer comprising a repeat unit having a formula of:

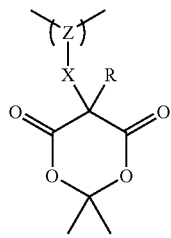

wherein Z represents a repeat unit of a polymer backbone; X is a linking group selected from the group consisting of alkylene, arylene, araalkylene, carbonyl, carboxyl, carboxyalkylene, oxy, oxyalkylene, and combinations thereof, and R is selected from the group consisting of hydrogen, alkyl, aryl, and cycloalkyl groups with the proviso that X and R are not part of the same ring system, a photo-acid generator, and a solvent;
exposing the film to radiation using a radiation source; and
developing the photoresist film to form the relief image.

14. The process of claim 13, wherein the photo-acid generator is in an amount from 0.5 to 10% by weight of the polymer.

15. The process of claim 13, wherein the repeat unit is

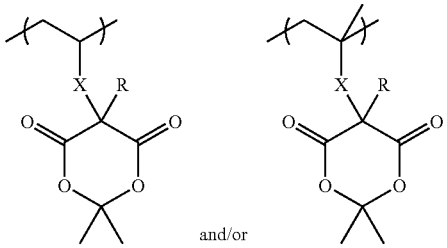

and/or.

16. The process of claim 13, wherein the repeat unit defines a copolymer having the formula:

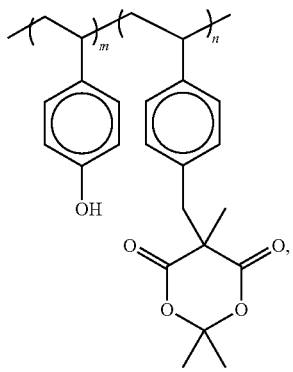

wherein m and n are at a ratio of greater than 0 to 99.99 mol %:0.01 to less than 100 mol %, respectively.

17. The process of claim 13, wherein the repeat unit defines a copolymer having the formula:

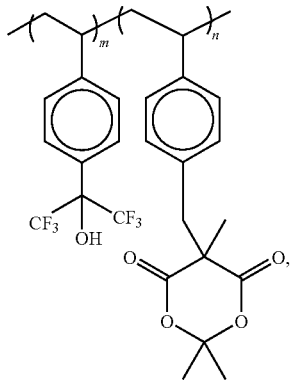

wherein m and n are at a ratio of greater than 0 to 99.99 mol %:0.01 to less than 100 mol %, respectively.

18. The process of claim 13, wherein the radiation from the radiation source comprises VUV (157 nm), ArF (193 nm), KrF (248 nm), EUV (13 nm), E-beam, X-ray, and ion beam.

19. The process of claim 18, comprising exposing the film to an irradiation dose in the range of about 1 mJ/cm$^2$ to about 100 mJ/cm$^2$.

20. The process of claim 13, wherein the photoresist composition has an outgassing rate of less than 6.5E+14 molecules/cm$^2$/s.

* * * * *